US007633151B2

(12) United States Patent
Too et al.

(10) Patent No.: US 7,633,151 B2

(45) Date of Patent: Dec. 15, 2009

(54) INTEGRATED CIRCUIT PACKAGE LID WITH A WETTING FILM

(75) Inventors: Seah Sun Too, San Jose, CA (US); Jacquana Diep, San Jose, CA (US); Mohammad Khan, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 95 days.

(21) Appl. No.: 11/687,514

(22) Filed: Mar. 16, 2007

(65) Prior Publication Data

US 2008/0230893 A1 Sep. 25, 2008

(51) Int. Cl.

| | |
|---|---|
| ***H01L 23/04*** | (2006.01) |
| ***H01L 23/12*** | (2006.01) |
| ***H01L 23/49*** | (2006.01) |
| ***H01L 21/58*** | (2006.01) |
| ***H01L 21/44*** | (2006.01) |

(52) U.S. Cl. ............................ 257/704; 257/E23.003; 257/E23.024; 257/E23.188; 257/E21.502; 257/E21.505; 257/E23.193; 257/E23.104; 257/E23.09; 257/E23.087; 257/23.092; 257/E25.013; 257/711; 438/126; 438/118; 438/125

(58) Field of Classification Search ................ 257/704, 257/E23.024, E23.188, E21.502, E23.003, 257/E21.505, E23.193, E23.104, E23.09, 257/E23.087, E23.092, E25.013, 711; 438/126, 438/118, 125

See application file for complete search history.

(56) References Cited

U.S. PATENT DOCUMENTS

| | | | | |
|---|---|---|---|---|
| 6,748,350 | B2 | 6/2004 | Rumer et al. | |
| 6,848,172 | B2 | 2/2005 | Fitzgerald et al. | |
| 6,848,610 | B2 | 2/2005 | Liu | |
| 6,867,978 | B2 | 3/2005 | Whittenburg et al. | |
| 6,870,258 | B1 | 3/2005 | Too | |
| 6,882,535 | B2 | 4/2005 | Labanok et al. | |
| 6,924,170 | B2 | 8/2005 | Ravi et al. | |
| 6,934,154 | B2 | 8/2005 | Prasher et al. | |
| 6,936,501 | B1 | 8/2005 | Too et al. | |
| 6,987,317 | B2 | 1/2006 | Pike | |
| 6,989,586 | B2 | 1/2006 | Agraharam et al. | |
| 7,009,289 | B2 | 3/2006 | Hu et al. | |
| 7,012,011 | B2 | 3/2006 | Chrysler et al. | |
| 7,014,093 | B2 | 3/2006 | Houle et al. | |
| 7,015,073 | B2 | 3/2006 | Houle et al. | |
| 7,081,375 | B2 * | 7/2006 | Baek et al. | 438/122 |
| 7,348,212 | B2 * | 3/2008 | Schiaffino et al. | 438/106 |
| 7,362,580 | B2 * | 4/2008 | Hua et al. | 361/709 |
| 2002/0020912 | A1 * | 2/2002 | Dishongh et al. | 257/712 |
| 2007/0284144 | A1 * | 12/2007 | Too et al. | 174/520 |
| 2007/0284737 | A1 * | 12/2007 | Too et al. | 257/737 |

OTHER PUBLICATIONS

Seah Sun Too et al.; Integrated Circuit Packaging; U.S. Appl No. 11/422,807, filed Jun. 7, 2006.

* cited by examiner

*Primary Examiner*—Alexander O Williams
(74) *Attorney, Agent, or Firm*—Timothy M. Honeycutt

(57) ABSTRACT

Various integrated circuit packages, lids therefor and methods of making the same are provided. In one aspect, a method of manufacturing is provided that includes providing an integrated circuit package lid that has a surface adapted to face towards an integrated circuit, and forming a wetting film on the surface. The wetting film has at least one void where the surface of the lid is exposed. The void inhibits bonding so that a stress reduction site is produced.

42 Claims, 6 Drawing Sheets

110 240 245a 250 245b 130 120 225 235 220 125 230 215 115 205 175 105 210

INTEGRATED CIRCUIT PACKAGE LID WITH A WETTING FILM

BACKGROUND OF THE INVENTION

1. Field of the Invention

This invention relates generally to semiconductor processing, and more particularly to integrated circuits, packages and sockets therefor and methods of making the same.

2. Description of the Related Art

Many current integrated circuits are formed as multiple die on a common silicon wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. An underfill material is deposited between the die and the substrate to act as a cushion and an adhesive to hold the die. After the die is mounted to the substrate, a lid is attached to the substrate to cover the die. Some conventional integrated circuits, such as microprocessors, generate sizeable quantities of heat that must be ferried away to avoid device shutdown or damage. For these devices, the lid serves as both a protective cover and a heat transfer pathway.

To provide a heat transfer pathway from the integrated circuit to the lid, a thermal interface material is placed on the upper surface of the integrated circuit. In an ideal situation, the thermal interface material fully contacts both the upper surface of the integrated circuit and the portion of the lower surface of the lid that overlies the integrated circuit. Conventional thermal interface materials include various types of pastes, and in some cases, a metal. More recently, designers have begun to turn to indium as a thermal interface material.

The attachment of a lid to a die substrate involves a complex choreography of steps. The thermal interface material must be applied to the die. An adhesive must be applied to the substrate and cured in such a way that does not produce unwanted irregularities in the thickness or wetting of the thermal interface material. The lid must be attached to the substrate so that the tilt of the lid relative to the die is within acceptable tolerances. High tilt can lead to nonuniformities in thermal interface material thickness, which can produce poor heat transfer characteristics.

Indium as a thermal interface material presents certain challenges. A consistent metallurgical bond between the integrated circuit and the indium, and in turn, between the indium and the package lid is desirable in order to provide a uniform thermal resistance heat transfer pathway away from the integrated circuit and into the lid. Achieving the necessary wetting of indium is not a trivial matter. Furthermore, the aforementioned tilt of the lid may be impacted by thermally-induced movement of the lid adhesive during steps to bond the indium.

Current techniques for establishing metallurgical bonding between a lid, an integrated circuit and the indium thermal interface material sandwiched therebetween involves the use of a flux film applied to both the upper surface of the integrated circuit and the upper surface of the indium thermal interface material. A subsequent reflow process produces a melting followed by a solidification of the indium material which produces the metallurgical bonding.

Lid construction materials are selected for different properties. One conventional design uses a copper core surrounded by a nickel jacket. Copper exhibits superior conductive heat transfer characteristics, but can easily corrode. Nickel is more corrosion resistant than copper.

If the surface of the lid facing toward the thermal interface material is a substance that does not natively bond metallurgically with the thermal interface material, it will be necessary to use a wetting film on the lid. Conventional lids utilize a gold film to facilitate wetting of indium during reflow. Conventional gold films are typically square and have footprints that generally track the footprints of the underlying die. After reflow, the entire common interface between the wetting film and the thermal interface material bonds. The large bonding area may create a new problem. Indium, copper and silicon have different coefficients of thermal expansion and thus strain at different rates during thermal cycling. The bonding area restricts the strain of the thermal interface material during thermal cycling. This can lead to stress build up in the underlying die and a consequent delamination of underfill material. Delamination can damage the electrical interconnects between the die and the package substrate.

The present invention is directed to overcoming or reducing the effects of one or more of the foregoing disadvantages.

SUMMARY OF THE INVENTION

In accordance with one aspect of the present invention, a method of manufacturing is provided that includes providing an integrated circuit package lid that has a surface adapted to face toward an integrated circuit, and forming a wetting film on the surface. The wetting film has at least one void where the surface of the lid is exposed.

In accordance with another aspect of the present invention, a method of manufacturing is provided that includes providing an integrated circuit package lid that has a surface adapted to face toward an integrated circuit that includes plural processor cores. A plurality of wetting films is formed on the surface. The plurality of wetting films is arranged to define a first plurality of voids therebetween that exposes portions of the surface. Each of the plurality of wetting films is arranged to align spatially with a corresponding one of the processor cores.

In accordance with another aspect of the present invention, a method of manufacturing is provided that includes providing an integrated circuit package lid that has a surface adapted to face toward an integrated circuit. A wetting film is formed on the surface. The wetting film has at least one void where the surface of the lid is exposed. An integrated circuit is provided. A thermal interface material is coupled to the wetting film and the integrated circuit. The at least one void inhibits bonding of the thermal interface material to the lid at the void.

In accordance with another aspect of the present invention, an apparatus is provided that includes an integrated circuit package lid that has a surface adapted to face toward an integrated circuit. A wetting film is coupled to the surface. The wetting film has at least one void where the surface of the lid is exposed.

In accordance with another aspect of the present invention, an apparatus is provided that includes an integrated circuit package lid that has a surface adapted to face toward an integrated circuit that includes plural processor cores. A plurality of wetting films is coupled to the surface. The plurality of wetting films is arranged to define a first plurality of voids therebetween that exposes portions of the surface. Each of the plurality of wetting films is arranged to align spatially with a corresponding one of the processor cores.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
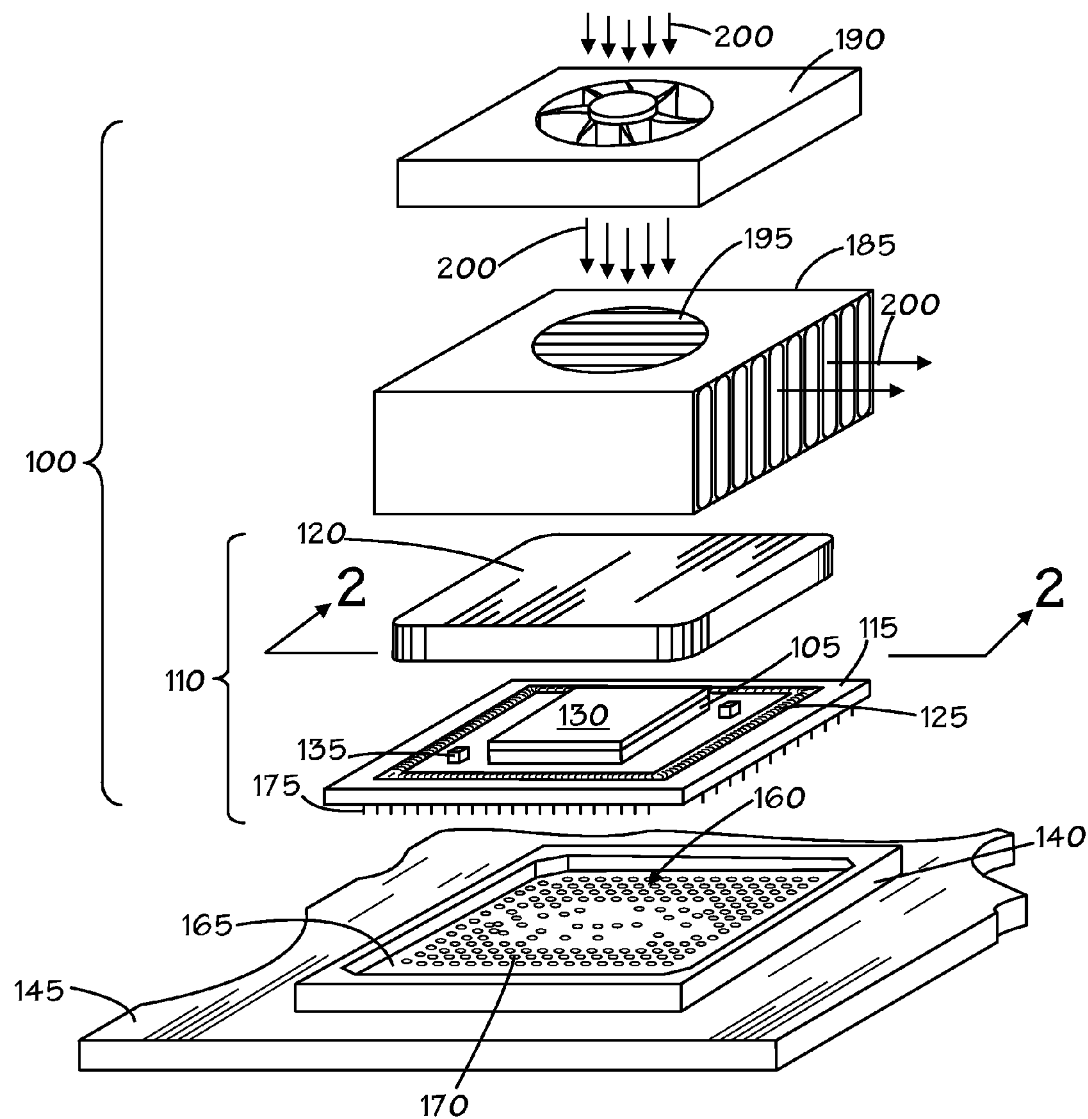
FIG. 1 is an exploded pictorial of an exemplary embodiment of an integrated circuit apparatus.

In the drawings described below, reference numerals are generally repeated where identical elements appear in more than one figure. Turning now to the drawings, and in particular to FIG. 1, therein is shown an exploded pictorial of an integrated circuit apparatus 100 that includes an integrated circuit 105 that is enclosed within an integrated circuit package 110 that includes a base substrate 115 and a lid 120. The integrated circuit 105 may be a semiconductor die or other type of device. The integrated circuit 105 may be any of a myriad of different types of circuit devices used in electronics, such as, for example, microprocessors, graphics processors, application specific integrated circuits, memory devices or the like. If implemented as a processor, the integrated circuit 105 may be single or multi-core.

The base substrate 115 may be a printed circuit board and composed of well-known plastics, ceramics, or other materials commonly used for integrated circuit packaging. The base substrate 115 may be a single layer or multilayer structure as desired.

The lid 120 is secured to the base substrate 115 by way of an adhesive bead 125 that has a general outline that tracks the shape of the perimeter of the overlying lid 120. One example of a suitable adhesive 125 is silicone-based thixotropic adhesive, which provides a compliant bond.

The integrated circuit 105 is provided with an overlying thermal interface material 130 that is designed to bond with an under surface of the overlying lid 120 and provide an effective conductive heat transfer pathway between the integrated circuit 105 and the lid 120. The thermal interface material 130 may be composed of a variety of metallic thermal interface materials, such as, for example, indium, gallium, platinum, gold, silver, combinations of these or the like. Mercury, if provided with suitable lateral barriers, such as, by way of a metal perimeter for example, could be used as a thermal interface material. In an exemplary embodiment, indium is used. Optionally, the thermal interface material 130 may be composed of polymeric materials such as, for example, silicone rubber mixed with aluminum particles and zinc oxide. Optionally, compliant base materials other than silicone rubber and thermally conductive particles other than aluminum may be used. Thermal greases and gold, platinum and silver represent a few examples.

The integrated circuit 105 is electrically connected to one or more external electronic devices, two of which are visible and one of which is labeled 135. The external devices 135 are typically capacitors, but may also be resistors, inductors or any of a variety of electronic devices used with integrated circuits. The integrated circuit 105 is electrically connected to the external devices 135 via electrical interconnects that are not visible.

The integrated circuit package 110 is designed to be seated in a socket 140 that is positioned on a printed circuit board, such as the printed circuit board 145. An interior space 160 of the socket 140 has a lower surface 165. The lower surface 165 is provided with a plurality of sockets 170 that are designed to receive respective conductor pins 175 that project downwardly from the substrate 115 of the package 110. It should be understood that the array of sockets 170 is designed to match the array of conductor pins 175 on the substrate 115. There may be more sockets 170 than conductor pins 175. The socket 140 may be constructed of well-known plastic materials and formed using well-known molding processes, such as injection molding. Connection methods other than pin-socket, such as soldering, land grid array, ball grid array, surface-mounted pin grid arrays or the like may be used to electrically interconnect the substrate 115 with the motherboard 145.

A heat sink 185 is designed to be seated on the upper surface of the lid 120 and an optional cooling fan 190 may be positioned on the heat sink 185. The heat sink 185 is designed to remove heat from the package 110 and may take on a myriad of different configurations. In this embodiment, the heat sink 185 includes an opening 195 through which a flow of air 200 may be moved by the cooling fan 190.

Figure 2:
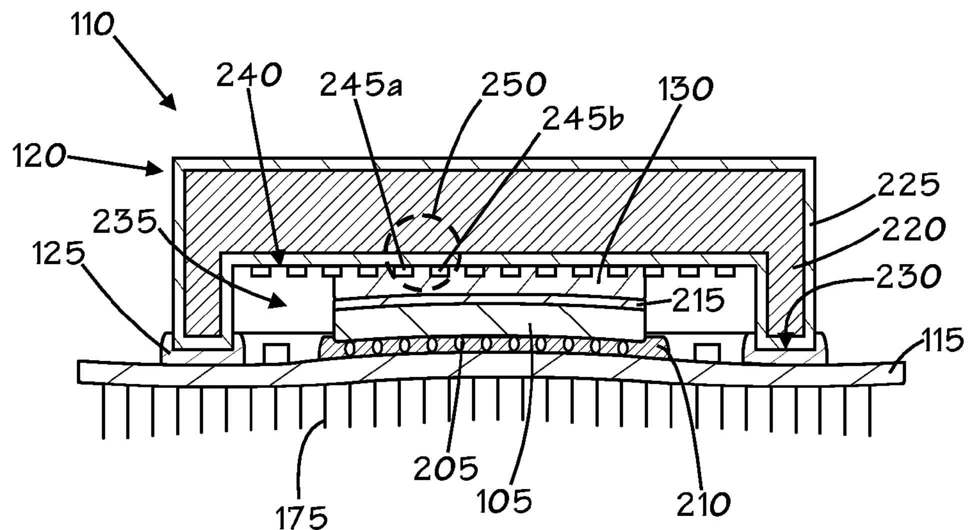
FIG. 2 is a sectional view of FIG. 1 taken at Section 2-2.

Attention is now turned to FIG. 2, which is a sectional view of FIG. 1 taken at Section 2-2. For simplicity of illustration, the optional cooling fan 200 and the motherboard 145 are not depicted. The integrated circuit 105 may be secured to the substrate 115 in a great variety of ways. In the embodiment illustrated, the integrated circuit 105 is flip-chip mounted to the substrate 115. A plurality of solder bumps 205 is positioned between the lower surface of the integrated circuit 105 and the upper surface of the substrate 115. The bumps 205 provide electrical interconnects between the integrated circuit 105 and a plurality of electrical conductors (not shown) positioned on the substrate 115 that are interconnected to the conductor pins 175. An underfill layer 210 is provided beneath the integrated circuit 105 to serve principally as a cushion against both physical and thermal expansion loads subjected to the integrated circuit 105. The base substrate 115 of the package 110 has a profile at Section 2-2 that, when viewed from the side, is not unlike a resurvey bow used in archery. The warping is caused by stresses induced by the underfill 250 and the adhesive 125 during various curing processes.

To facilitate the wetting of the thermal interface material 130 to the integrated circuit 105, the upper surface, i.e., the backside, of the integrated circuit 105 is provided with a metallization stack 215. The composition of the backside metallization 215 is selected to match properties of the overlying and underlying films. In this illustrative embodiment, the stack 215 consists of an aluminum film formed on the integrated circuit 105, a titanium film formed on the aluminum film, a nickel-vanadium film formed on the titanium film and a gold film formed on the nickel-vanadium film. The aluminum film provides advantageous adhesion with silicon. The titanium film provides a barrier layer to prevent gold and indium from migrating into the integrated circuit 105 and to facilitate adhesion with the nickel-vanadium film, and the nickel-vanadium film provides desirable adhesion with gold and a barrier to inhibit diffusion into the titanium layer. The gold film provides a desirable wetting surface for indium. The stack 215 is formed on the integrated circuit 105 prior to application of the thermal interface material 130.

The lid 120 is advantageously composed of a material or materials with a relatively favorable conductive heat transfer coefficient. In an exemplary embodiment, the lid 120 consists of a copper core 220 surrounded by a nickel jacket 225. However, other materials may be used for the lid 120, such as anodized aluminum, aluminum-silicon-carbide, aluminum nitride, boron nitride or the like. The lid 120 is generally rectangular and may be substantially square if desired. The lid 120 includes a downwardly projecting perimeter wall 230 that defines an interior space 235. The interior space 235 is sized to more than accommodate the footprint of the integrated circuit 105 and the overlying thermal interface material 130.

Figure 3:
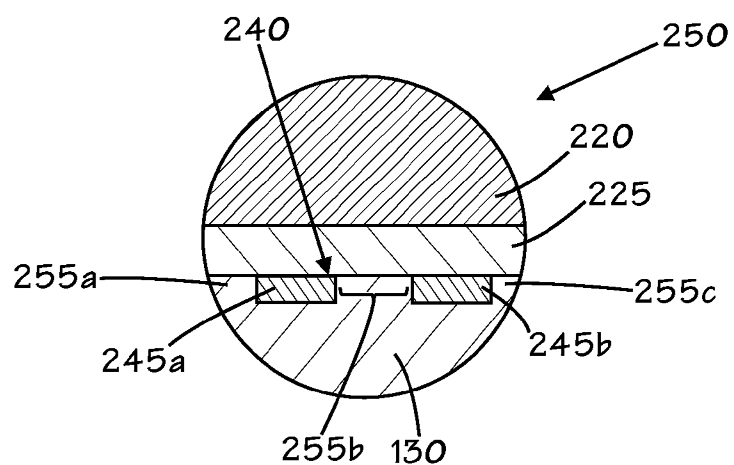
FIG. 3 is a magnified portion of FIG. 2.

To facilitate metallurgical bonding between the thermal interface material 130 and a lower surface 240 of the lid interior space 235, a wetting film is provided on the undersurface 240. The wetting film appears in FIG. 2 as a plurality of spaced-apart boxes, two of which are labeled 245*a* and 245*b*. A more complete depiction of the wetting film 245 is provided in FIG. 3 discussed below. The wetting film 245 is composed of a material or materials that readily wet the metallic thermal interface material during a thermal reflow process. The desired material or materials for the wetting film 82 will be dictated somewhat by the properties of the thermal interface material. Gold, platinum, palladium, alloys of these or the like are possible materials. Gold readily wets with indium.

The various thicknesses of the thermal interface material 130 and the wetting film 245 as well as the vertical dimension of the interior space 235 are selected so that when the lid 120 is seated on the adhesive film 125, the thermal interface material 130 and the overlying film 245 will be in physical contact.

Unlike conventional gold plating which consists of a continuous rectangular sheet, the gold film 245 is configured in a pattern that leaves some portions of the lower surface 240 of the lid 120 exposed. To facilitate an understanding of the purpose of the patterning, a portion of FIG. 2 circumscribed by the dashed circle 250 is shown at higher magnification in FIG. 3. Attention is now turned to FIG. 3. It should be noted that the circumscribed portion 250 includes a small portion of the copper core 220 and the surrounding nickel jacket 225. In addition, a small portion of the thermal interface material 130 and the portions 245*a* and 145*b* of the wetting film are visible as well. The patterning of the wetting film yields the portions 245*a* and 245*b* and voids or regions 255*a*, 255*b* and 255*C* that expose portions of the lid jacket 225. Following a thermal reflow process, the thermal interface material 130 will establish metallurgical bonding with the portions 245*a* and 245*b* of the wetting film, but not with the jacket 225 in the regions 255*a*, 255*b* and 255*C*. Consequently, the thermal interface material 130 can much more readily undergo strains in the regions 255*a*, 255*b* and 255*c* associated with thermal cycling. This enhanced ability to undergo strains lowers the stresses on the thermal interface material 130 that might otherwise propagate into the die 105 and cause a delamination of the underfill material 215 (See FIG. 2). The same effect occurs across the entire interface between the thermal interface material 130 and the lower surface 240 of the lid jacket 225.

Figure 4:
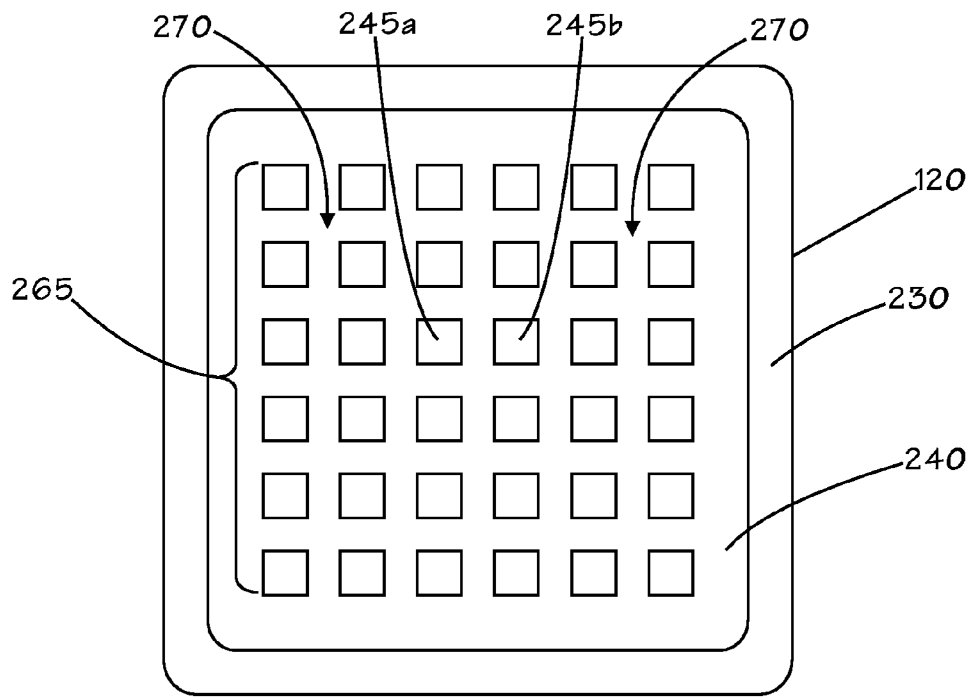
FIG. 4 is a plan view of the underside of an exemplary embodiment of a package lid of the apparatus of FIG. 1.

A better appreciation of the structure of the wetting film may be understood by referring now to FIG. 4, which is a view of the underside of the lid 120. The lid 120 is actually flipped over and thus FIG. 4 is essentially an overhead view of the underside of the lid 120. Accordingly, the perimeter wall 230 of the lid 120 is clearly visible as well as the lower surface 240. The two portions 245*a* and 245*b* of the wetting film are depicted and labeled and together with the other portions that make up the wetting film that is now labeled collectively 265. All of the voids 270 between the various portions of the wetting film 265 provide areas where the thermal interface material 130 (See FIGS. 2 and 3) does not form a metallurgical bond with an overlying film and thus those areas provide stress relief sites for the thermal interface material.

Figure 5:
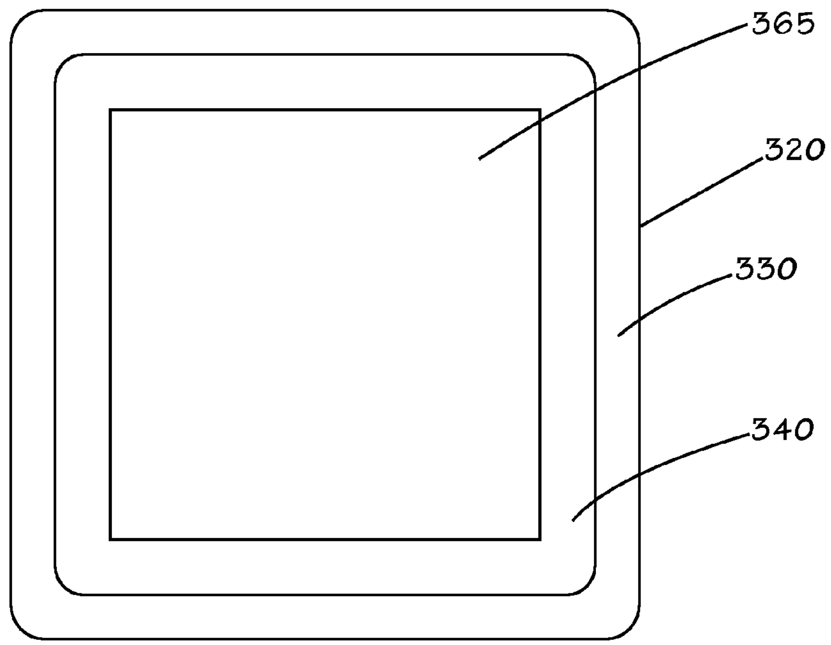
FIG. 5 is a plan view of the underside of a conventional package lid.

It may be useful at this point to contrast a conventional wetting film design. Attention is now turned to FIG. 5, which is a view like FIG. 4, but of a conventional lid 320 that includes a lower surface 340 upon which a rectangular gold sheet 365 is positioned. The conventional gold sheet 365 is sized to be slightly larger than the footprint of the thermal interface material that would metallurgically bond thereto. The goal of the conventional sheet 365 is to provide metallurgical bonding across the entirety of the surface of the thermal interface material. As noted in the Background section hereof, this conventional design can lead to the thermal stress induced delamination of the die underfill material.

Figure 6:
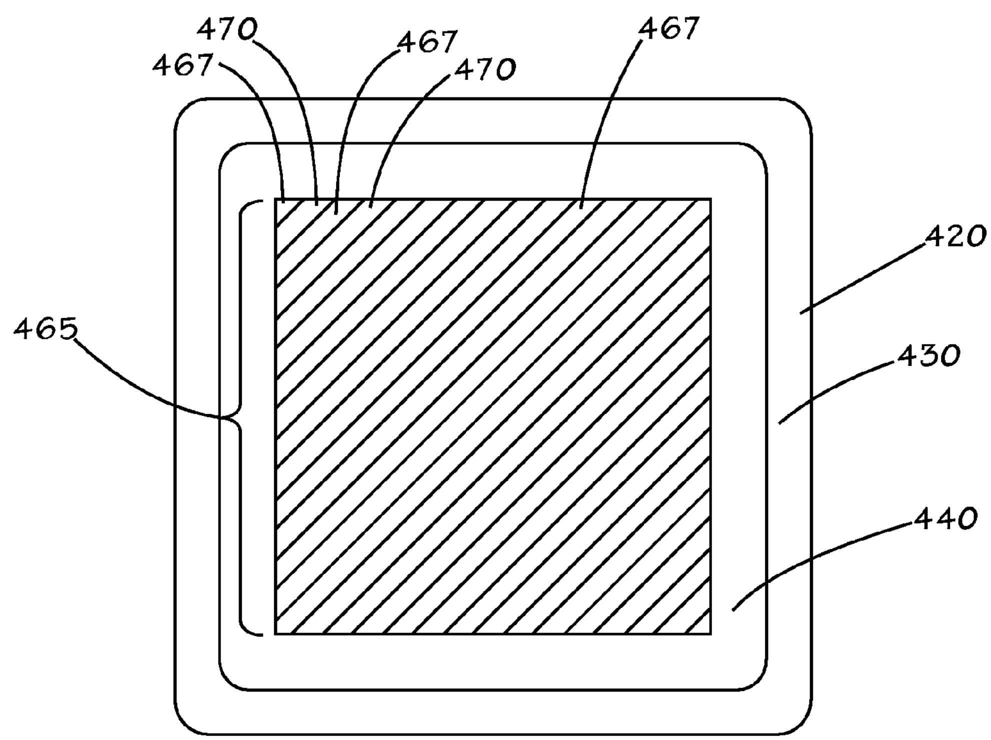
FIG. 6 is a plan view like FIG. 4 of an alternate exemplary embodiment of a package lid.

While the wetting film 265 is depicted as an array of rectangular squares of wetting material in FIG. 4, the skilled artisan will appreciate that the wetting film may take on a large variety of different geometries and still provide the advantageous features of eliminating certain areas where metallurgical bonding of the thermal interface material can take place and thus provide stress relief sites. An alternate exemplary embodiment is depicted in FIG. 6, which is a view like FIG. 4, but of a lid 420 that includes a perimeter wall 430 and a lower surface 440. In this illustrative embodiment, a wetting film 465 consists of a plurality of angularly disposed lines 467 spaced apart to define a plurality of interspersed voids or troughs 470. Note that only a few of the lines 467 and the intervening troughs 470 are labeled. Here again, the lines 467 provide areas where the thermal interface material will metallurgically bond to the layer 465 but the troughs 470 provide areas where the thermal interface material will not metallurgically bond and thus establish stress reduction sites.

Figure 7:
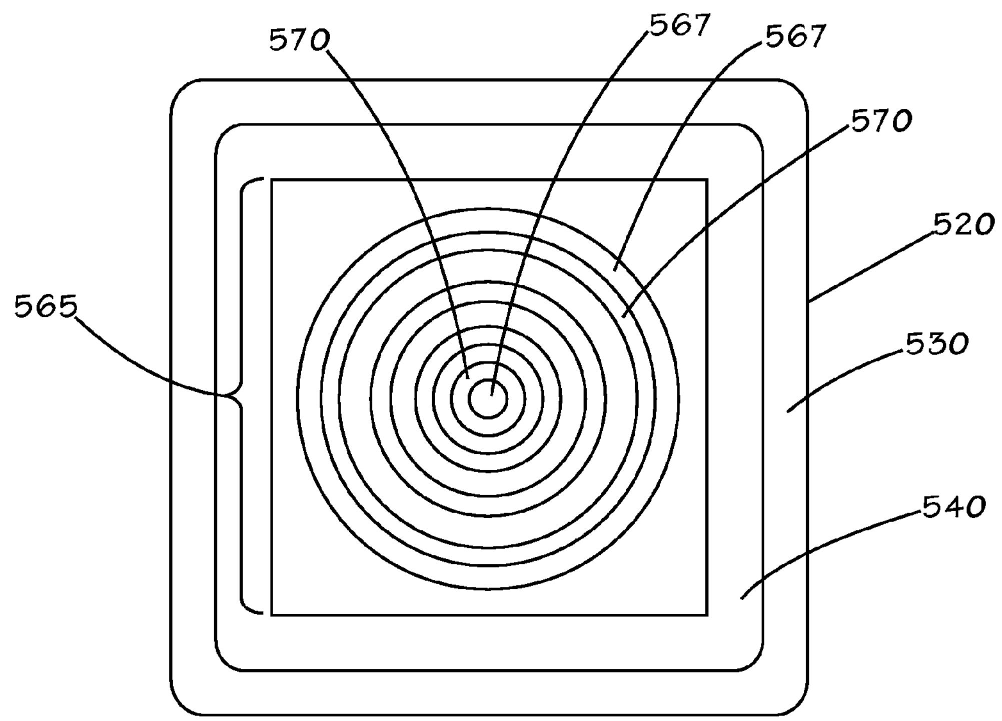
FIG. 7 is a plan view like FIG. 4 of another alternate exemplary embodiment of a package lid.

Another alternate embodiment is depicted in FIG. 7, which is a view like FIG. 6. In this illustrative embodiment, a lid 520 is provided with a peripheral wall 530 and a lower surface 540. A wetting film 565 is formed on the lower surface 540. The wetting film 565 includes a pattern formed therein that defines a plurality of circular plateaus 567 divided by an interspersed plurality of circular voids or troughs 570. Again, and for simplicity of illustration, only a few of the plateaus 567 and troughs 570 are labeled. Like the other illustrative embodiments, the purpose of the patterning of the wetting film 565 is to provide the plateaus 567 which will enable the metallurgical bonding with a thermal interface material while simultaneously providing the troughs 570 that inhibit metallurgical bonding and thus provide stress reduction sites.

Figure 8:
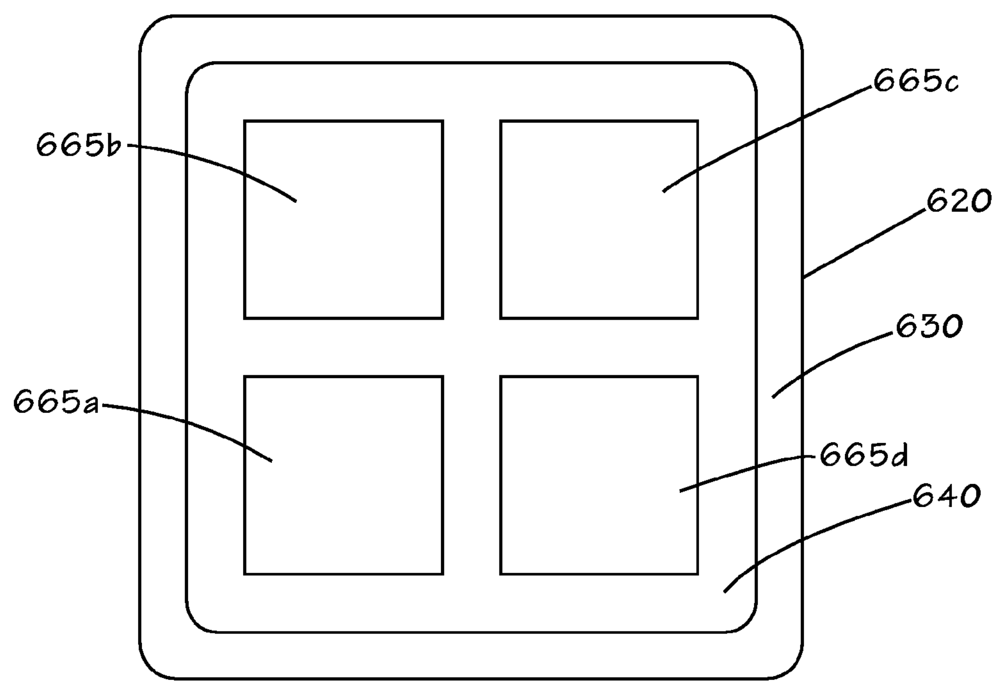
FIG. 8 is a plan view like FIG. 4 of another alternate exemplary embodiment of a package lid.

Another alternate exemplary embodiment is depicted in FIG. 8, which is a view like FIGS. 6 and 7. In FIG. 8, a lid 620 is provided again with a peripheral wall 630 and a lower surface 640. In this embodiment, four wetting films 665*a*, 665*b*, 665*c* and 665*d* are provided. The wetting films 665*a*, 665*b*, 665*c* and 665*d* are dimensioned to track the respective footprints of core portions of an integrated circuit over which the lid 630 may be positioned. For example, in those integrated circuits that utilize multiple processor cores, the wetting films 665*a*, 665*b*, 665*c* and 665*d* may be dimensioned and arrayed to match the footprints of and be aligned spatially with the individual processor cores of the underlying integrated circuit. The skilled artisan will appreciate that the number, size and arrangement of the wetting films 665*a*, 665*b*, 665*c* and 665*d* may be tailored to match the number of processor cores of the underlying integrated circuit.

Figure 9:
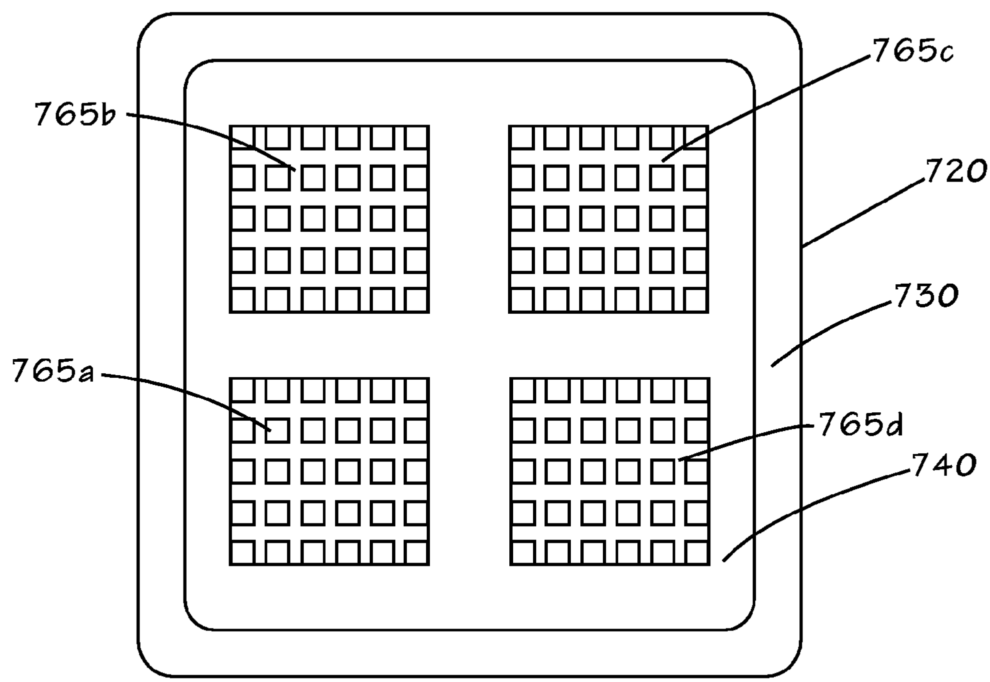
FIG. 9 is a plan view like FIG. 4 of another alternate exemplary embodiment of a package lid.

Another illustrative embodiment is depicted in FIG. 9, which is a view like FIG. 8. A lid 720 is again provided with a peripheral wall 730 and a lower surface 740. Like the embodiment depicted in FIG. 8, four wetting films 765*a*, 765*b*, 765*c* and 765*d* are formed on the lower surface 740. However, unlike the embodiment depicted in FIG. 8, the wetting films 765*a*, 765*b*, 765*c* and 765*d* may each be individually provided with patterned features of the type depicted in any of the embodiments of FIGS. 4, 6 and 7. In this way, a given wetting film for a given processor core may be provided with a pattern of wetting material that provides not only metallurgical bonding for a thermal interface material for that particular processor core but also stress reduction at those areas of the pattern where no metallurgical bonding with the thermal interface materials occurs. Any combination of one or more of the wetting films 765*a*, 765*b*, 765*c* and 765*d* may be patterned as desired.

While well-known gold-plating techniques may be used to form the wetting films 265, 465, 565, 665*a*, 665*b*, 665*c*, 665*d*, 765*a*, 765*b*, 765*c* and 765*d* disclosed herein, other gold deposition or forming techniques may be used, such as sputtering. The patterns in the films 265, 465, 565, 665*a*, 665*b*, 665*c*, 665*d*, 765*a*, 765*b*, 765*c* and 765*d* maybe formed at the same time as the films themselves or separately using the plating technique itself, by etching, laser ablation or other patterning techniques. The desired thicknesses of the wetting films 265, 465, 565, 665*a*, 665*b*, 665*c*, 665*d*, 765*a*, 765*b*, 765*c* and 765*d* will depend on the properties of the thermal interface material and the lid. In an exemplary embodiment configured with an indium thermal interface material and a nickel-jacketed lid, a thickness of about 0.01 to 0.5 microns may be used.

Figure 10:
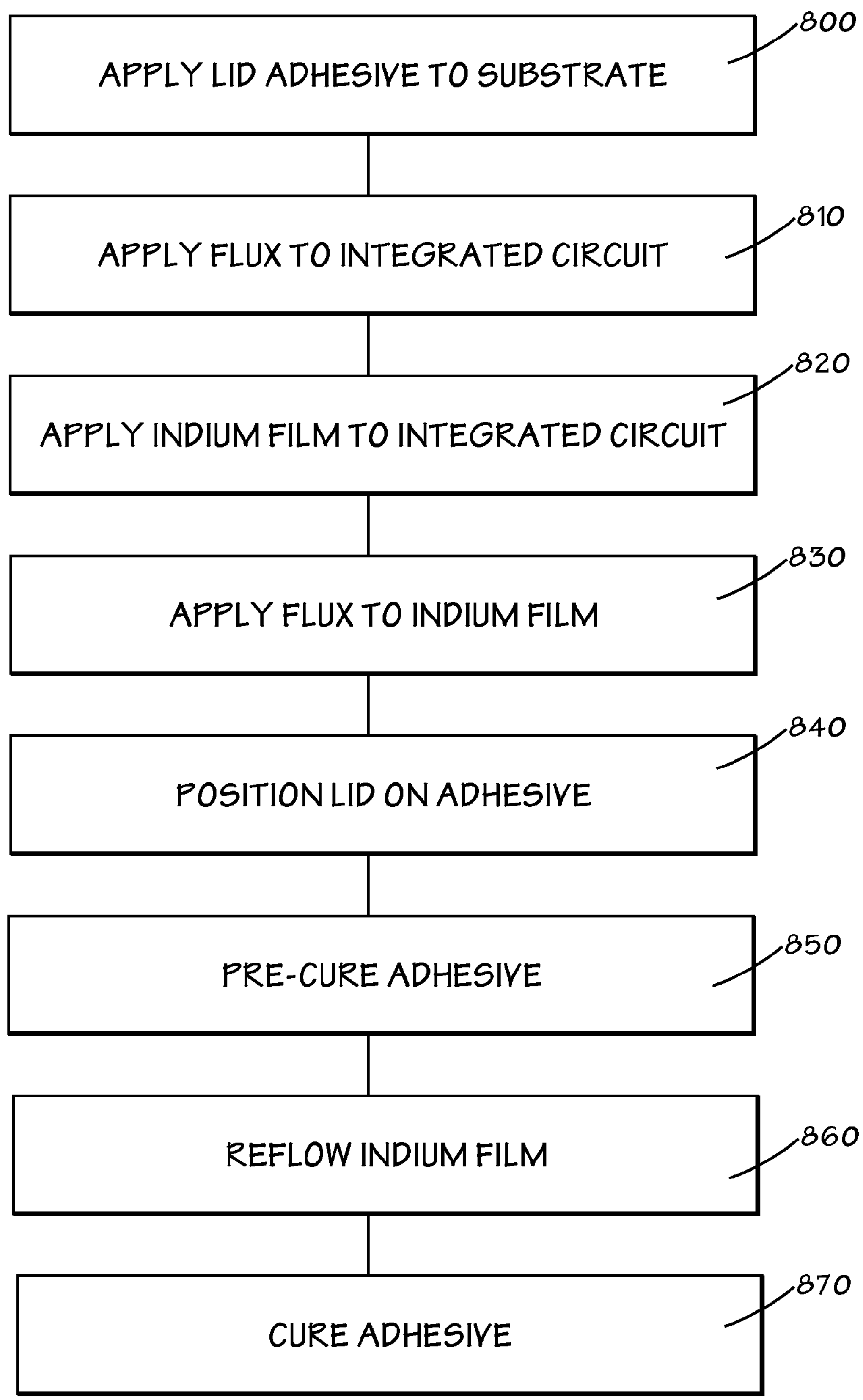
FIG. 10 is a flow chart depicting an exemplary process for assembling an exemplary package lid and substrate.

An exemplary process flow for attaching the lid 120 to the substrate 115 will now be described in conjunction with FIGS. 1, 2 and 10. The process will be described in the context of an indium thermal interface material. However, other materials may be used as noted elsewhere herein. Following the mounting of the integrated circuit 105 and the fabrication of the backside metal stack 215, the adhesive film 125 is applied to the substrate 115 in step 260 of FIG. 10.

At step 800, a film of flux is applied to the integrated circuit 105. The purpose of the flux is to facilitate an ultimate metallurgical bonding between the later-applied indium thermal interface material and the backside metallization stack 215. A rosin-based flux is advantageously used as the flux material. In an exemplary embodiment, the flux may consist of about 20 to 50% by weight rosin mixed with isopropyl alcohol. A jet spray or other suitable application technique may be used to apply the flux.

At step 810, the indium thermal interface material 130 is applied to the integrated circuit 105. This may be done in at least two ways. In this illustrative embodiment, a preformed film of indium with roughly the same footprint as the integrated circuit 105 is applied to the backside metallization 215. Alternatively, the perform may be secured to the lid 120 and the lid 120 in turn may be brought into contact with the integrated circuit 105. The preformed indium thermal interface material 130 may be supplied in a variety of forms. In an exemplary embodiment, preformed pieces of indium may be supplied on a tape that is positioned on a reel. The tape is advanced and individual preformed pieces or sheets of indium are removed from the tape and placed on the integrated circuit 105. The movement of the indium performs may be by hand, an automated pick and place mechanism or other type of mechanism. The ultimate uniformity in terms of thickness and material distribution of the indium thermal interface material 130 is a function of the degree of tilt of the lid 120 with respect to the substrate 115. It is desirable for the degree of tilt to be as small as possible. The indium thermal interface material 130 will require a reflow process to establish the desired metallurgical bonding with the lid 120 and the integrated circuit 105. It is desired that the reflow process not adversely impact the tilt characteristics of the lid 120. Accordingly, it is preferable to perform a precure process on the adhesive 125. The goal of the precure process is to partially harden the adhesive 125 before the indium thermal interface material 130 undergoes a reflow. In this way, the reflow process will not cause substantial movement either laterally or vertically of the adhesive film and thus the overlying lid 120 during the indium reflow process.

Prior to precure, flux is applied to the indium film 130 at step 830 and the lid 120 is seated on the adhesive film 125 at step 840. A rosin-based flux of the type described elsewhere herein may be used. The seating process may be accomplished by hand with the aid of well-known guide racks or by way of automated machines. The lid 120 may be preheated prior to seating on the adhesive 125. For example, the lid 120 may be heated to about 100 to 135° C. for 5.0 to 10.0 minutes. The preheated lid 120 is next seated on the adhesive 125. It is anticipated that the temperature of the lid 120 will drop by perhaps 10.0 to 15.0° C. before being seated on the adhesive 125. At the time when the lid 120 is seated on the adhesive 125, the substrate 115 may be positioned in a fixture also to be described in more detail below and a compressive force applied to the lid 120 by way of the fixture. It should be noted that the adhesive 125 may be applied at any point prior to the seating of the lid 120.

With compressive force applied, the substrate 115 and lid 120 combination are subjected to a precure heating at step 850. Suitable temperatures and times for the precure will depend on the adhesive and the thermal interface material. Fast curing adhesives may require as little as about 2.0 minutes at 100° C., however, a precure time of up to an hour will be more typical. The precure process will fix the indium bond line thickness, that is, the thickness of the thermal interface material 130.

Following the precure at step 850, an indium reflow step is performed at step 860. In an exemplary process for indium, the package 110 may be placed in a belt furnace with a nitrogen purge, and heated to about 170 to 190° C. for about 3.0 to 10.0 minutes. The reflow is advantageously performed without compressive force applied to the lid 120. Again, the goal of the indium reflow is to establish metallurgical bonding between the indium thermal interface material 130 and the overlying gold film (245*a*, 245*b* or any of the other embodiments disclosed herein) and the underlying backside metallization stack 215.

Following the indium reflow step 860, the adhesive film 125 undergoes a final curing process at step 870. The curing process is performed without compressive force applied to the lid 120. The final cure may be performed at about 125° C. for about 1.5 hours. Again the temperature and time will depend on the adhesive used.

It should be understood that movement of the various pieces of the package 110 as well as various process steps, such as lid preheating, lid placement and lid compression, may be accomplished by automated machine, by hand, or by a combination of the two. For example, a Dai-Ichi Seiko model LAS64 lid attach machine may be used. The LAS64 is capable of high precision lid placement, lid preheating and lid compression. Of course, other types of machines may be used in this regard.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:

providing an integrated circuit package lid including a surface adapted to face towards an integrated circuit; and forming a wetting film on the surface, the wetting film having at least one void where the surface of the integrated circuit package lid is exposed.

2. The method of claim 1, wherein the forming a wetting film comprises forming a gold wetting film.

3. The method claim 1, comprising coupling a thermal interface material to the wetting film.

4. The method claim 3, comprising coupling the integrated circuit to the thermal interface material.

5. The method of claim 3, wherein the thermal interface material comprises indium.

6. The method of claim 1, comprising coupling a substrate including the integrated circuit to the lid.

7. The method of claim 6, comprising coupling the substrate to another substrate.

8. The method of claim 1, wherein the wetting film comprises a plurality of rectangular portions arranged to define a plurality of voids that expose portions of the surface of the integrated circuit package lid.

9. A method of manufacturing, comprising:

providing an integrated circuit package lid including a surface adapted to face towards an integrated circuit including plural processor cores; and forming a plurality of wetting films on the surface, the plurality of wetting films being arranged to define a first plurality of voids therebetween that expose portions of the surface of the integrated circuit package lid, each of the plurality of wetting films being arranged to align spatially with a corresponding one of the processor cores.

10. The method of claim 9, wherein at least one of the plurality of wetting films is formed with at least one void to expose a portion of the surface of the integrated circuit package lid.

11. The method of claim 9, wherein each of the plurality of wetting films is formed with at least one void to expose a portion of the surface of the integrated circuit package lid.

12. The method of claim 9, wherein the forming of a plurality of wetting films comprises forming a plurality of gold wetting films.

13. The method claim 9, comprising coupling a thermal interface material to the plurality of wetting films.

14. The method claim 13, comprising coupling the integrated circuit to the thermal interface material such that each of the plurality of wetting films is aligned spatially with the corresponding one of the processor cores.

15. The method of claim 13, wherein the thermal interface material comprises indium.

16. The method of claim 9, comprising coupling a substrate including the integrated circuit to the integrated circuit package lid.

17. The method of claim 16, comprising coupling the substrate to another substrate.

18. The method of claim 9, wherein the plurality of wetting films comprises a plurality of rectangular portions arranged to define the first plurality of voids that expose portions of the surface of the integrated circuit package lid.

19. A method of manufacturing, comprising:

providing an integrated circuit package lid including a surface adapted to face towards an integrated circuit;

forming a wetting film on the surface, the wetting film including at least one void where the surface of the integrated circuit package lid is exposed;

providing an integrated circuit;

coupling a thermal interface material to the wetting film and the integrated circuit, the at least one void inhibiting bonding of the thermal interface material to the integrated circuit package lid at the void.

20. The method of claim 19, wherein the forming a wetting film comprises forming a gold wetting film.

21. The method of claim 19, wherein the thermal interface material comprises indium.

22. The method of claim 1, comprising coupling a substrate to the integrated circuit and the lid.

23. The method of claim 22, comprising coupling the substrate to another substrate.

24. The method of claim 19, wherein the wetting film comprises a plurality of rectangular portions arranged to define a plurality of voids that expose portions of the surface of the integrated circuit package lid.

25. An apparatus, comprising:

an integrated circuit package lid including a surface adapted to face towards an integrated circuit; and a wetting film coupled to the surface, the wetting film including at least one void where the surface of the integrated circuit package lid is exposed.

26. The apparatus of claim 25, wherein the wetting film comprises a gold wetting film.

27. The apparatus claim 25, comprising a thermal interface material coupled to the wetting film.

28. The apparatus claim 27, comprising the integrated circuit coupled to the thermal interface material.

29. The apparatus of claim 27, wherein the thermal interface material comprises indium.

30. The apparatus of claim 25, comprising a substrate coupled to the integrated circuit and the integrated circuit package lid.

31. The apparatus of claim 30, comprising another substrate coupled to the substrate.

32. The apparatus of claim 25, wherein the wetting film comprises a plurality of rectangular portions arranged to define a plurality of voids that expose portions of the surface of the integrated circuit package lid.

33. An apparatus, comprising:

an integrated circuit package lid including a surface adapted to face towards an integrated circuit including plural processor cores; and a plurality of wetting films on the surface, the plurality of wetting films being arranged to define a first plurality of voids therebetween that expose portions of the surface, each of the plurality of wetting films being arranged to align spatially with a corresponding one of the processor cores.

34. The apparatus of claim 33, wherein at least one of the plurality of wetting films comprises at least one void to expose a portion of the surface of the integrated circuit package lid.

35. The apparatus of claim 33, wherein each of the plurality of wetting films comprises at least one void to expose a portion of the surface of the integrated circuit package lid.

36. The apparatus of claim 33, wherein the plurality of wetting films comprises a plurality of gold wetting films.

37. The apparatus claim 33, comprising a thermal interface material coupled to the plurality of wetting films.

38. The apparatus claim 37, comprising the integrated circuit including plural processor cores coupled to the thermal interface material.

39. The apparatus of claim 37, wherein the thermal interface material comprises indium.

40. The apparatus of claim 33, comprising a substrate coupled to the integrated circuit package lid and the integrated circuit.

41. The apparatus of claim 40, comprising another substrate coupled to the substrate.

42. The apparatus of claim 33, wherein the plurality of wetting films comprises a plurality of rectangular portions arranged to define the first plurality of voids that expose portions of the surface of the integrated circuit package lid.

* * * * *